US009037777B2

(12) United States Patent
Sabbag

(10) Patent No.: US 9,037,777 B2
(45) Date of Patent: May 19, 2015

(54) DEVICE, SYSTEM, AND METHOD FOR REDUCING PROGRAM/READ DISTURB IN FLASH ARRAYS

(75) Inventor: Erez Sabbag, Kiryat Tivon (IL)

(73) Assignee: DENSBITS TECHNOLOGIES LTD., Haifa (IL)

( * ) Notice: Subject to any disclaimer, the term of this patent is extended or adjusted under 35 U.S.C. 154(b) by 1019 days.

(21) Appl. No.: 12/969,500

(22) Filed: Dec. 15, 2010

(65) Prior Publication Data

US 2011/0153919 A1    Jun. 23, 2011

Related U.S. Application Data

(60) Provisional application No. 61/288,875, filed on Dec. 22, 2009.

(51) Int. Cl.
*G11C 11/56*      (2006.01)
*G11C 16/34*      (2006.01)

(52) U.S. Cl.
CPC ........ *G11C 11/5628* (2013.01); *G11C 16/3495* (2013.01); *G11C 2211/5648* (2013.01)

(58) Field of Classification Search
CPC .................. G11C 11/5628; G11C 2211/5648
See application file for complete search history.

(56) References Cited

U.S. PATENT DOCUMENTS

| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,592,641 A | 1/1997 | Doyle et al. |

(Continued)

FOREIGN PATENT DOCUMENTS

| WO | WO2009053963 A2 | 4/2009 |
| WO | WO 2009053963 A2 * | 4/2009 |

OTHER PUBLICATIONS

Search Report of PCT Patent Application WO 2009/118720 A3.

(Continued)

*Primary Examiner* — Aimee Li
*Assistant Examiner* — Gary W Cygiel
(74) *Attorney, Agent, or Firm* — Dentons US LLP

(57) ABSTRACT

A method, device and computer readable medium for programming a nonvolatile memory block. The method may include programming information, by a memory controller, to the nonvolatile memory block by performing a sequence of programming phases of descending bit significances. The device may include a nonvolatile memory block; and a memory controller that may be configured to determine a bit significance level of the nonvolatile memory block; program the nonvolatile memory block by performing at least one programming phase; and program the nonvolatile memory block to an erase value that may be higher than the pre-erase value; wherein the erase value and the pre-erase value may be selected based on the bit significance level of the nonvolatile memory block. The method may include packing three single level cell (SLC) nonvolatile memory blocks to one three-bit per cell nonvolatile memory block in order of the three SLC bit significances.

43 Claims, 5 Drawing Sheets

(56) References Cited

U.S. PATENT DOCUMENTS

| | | |
|---|---|---|
| 5,623,620 A | 4/1997 | Alexis et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Morris et al. |
| 5,729,490 A | 3/1998 | Calligaro et al. |
| 5,740,395 A | 4/1998 | Wells et al. |
| 5,745,418 A | 4/1998 | Hu et al. |
| 5,778,430 A | 7/1998 | Ish et al. |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park et al |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett et al. |
| 7,388,781 B2 | 6/2008 | Litsyn et al. |
| 7,395,404 B2 | 7/2008 | Gorobets et al. |
| 7,441,067 B2 | 10/2008 | Gorobets et al. |
| 7,443,729 B2 | 10/2008 | Li et al. |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell et al. |
| 7,619,922 B2 | 11/2009 | Li et al. |
| 7,697,326 B2 | 4/2010 | Sommer et al. |
| 7,706,182 B2 | 4/2010 | Shalvi et al. |
| 7,716,538 B2 | 5/2010 | Gonzalez et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun et al. |
| 7,961,797 B1 | 6/2011 | Yang et al. |
| 7,975,192 B2 | 7/2011 | Sommer et al. |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang et al. |
| 8,250,324 B2 | 8/2012 | Haas et al. |
| 8,300,823 B2 | 10/2012 | Bojinov et al. |
| 8,305,812 B2 | 11/2012 | Levy et al. |
| 8,327,246 B2 | 12/2012 | Weingarten et al. |
| 8,407,560 B2 | 3/2013 | Ordentlich et al. |
| 8,417,893 B2 | 4/2013 | Khmelnitsky et al. |
| 2001/0034815 A1 | 10/2001 | Dugan et al. |
| 2002/0063774 A1 | 5/2002 | Hillis et al. |
| 2002/0085419 A1 | 7/2002 | Choi et al. |
| 2002/0154769 A1 | 10/2002 | Petersen et al. |
| 2002/0156988 A1 | 10/2002 | Sekibe et al. |
| 2002/0174156 A1 | 11/2002 | Birru et al. |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Jeong et al. |
| 2003/0192007 A1 | 10/2003 | Miller et al. |
| 2004/0015771 A1 | 1/2004 | Lasser et al. |
| 2004/0030971 A1 | 2/2004 | Shibata et al. |
| 2004/0059768 A1 | 3/2004 | Denk et al. |
| 2004/0080985 A1 | 4/2004 | Chang et al. |
| 2004/0153722 A1 | 8/2004 | Lee |
| 2004/0153817 A1 | 8/2004 | Chevallier et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0195651 A1 | 8/2006 | Estakhri et al. |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes et al. |

(56) References Cited

U.S. PATENT DOCUMENTS

| | | |
|---|---|---|
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Sokolov et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2008/0310230 A1* | 12/2008 | Kim et al. ............... 365/185.11 |
| 2009/0024905 A1 | 1/2009 | Shalvi et al. |
| 2009/0027961 A1 | 1/2009 | Park et al. |
| 2009/0043951 A1 | 2/2009 | Shalvi et al. |
| 2009/0046507 A1* | 2/2009 | Aritome ................ 365/185.02 |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn |
| 2009/0132755 A1 | 5/2009 | Radke |
| 2009/0144598 A1 | 6/2009 | Yoon et al. |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi et al. |
| 2009/0287930 A1 | 11/2009 | Nagaraja |
| 2009/0300269 A1 | 12/2009 | Radke et al. |
| 2009/0323942 A1 | 12/2009 | Sharon et al. |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto et al. |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette et al. |
| 2010/0293321 A1 | 11/2010 | Weingarten |
| 2010/0318724 A1* | 12/2010 | Yeh ............................. 711/103 |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang et al. |
| 2011/0209028 A1 | 8/2011 | Post et al. |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |

(56) References Cited

U.S. PATENT DOCUMENTS

| | | |
|---|---|---|
| 2012/0110250 A1 | 5/2012 | Sabbag et al. |
| 2012/0124273 A1 | 5/2012 | Goss et al. |
| 2012/0246391 A1 | 9/2012 | Meir et al. |

OTHER PUBLICATIONS

Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Kcshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-II-372 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips. com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., " Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

\* cited by examiner

500

US 9,037,777 B2

DEVICE, SYSTEM, AND METHOD FOR REDUCING PROGRAM/READ DISTURB IN FLASH ARRAYS

CROSS-REFERENCE TO RELATED APPLICATIONS

This application claims the benefit of priority, under 35 U.S.C. §119, of U.S. Provisional Patent Application No. 61/288,875, filed Dec. 22, 2009, titled "A System and Method To Reduce Program/Read Disturb in Flash Arrays While Enhancing Flash Management," which is hereby incorporated in its entirety.

BACKGROUND

Modern flash memory devices may store information as charge in cells, where each cell may be made of a floating gate transistor or an NROM transistor. In single-level cell (SLC) flash memory devices, each cell may store only one bit of information. Multi-level cell (MLC) flash memory devices can store more than one bit per cell by choosing between more than one pair of levels of electrical charge to apply to the floating gates of their cells. The applied charge (also known as charge level) may be measured by a detector. The detector may compare the voltage of the transistor gate (also known as charge level and denoted VT) to a decision threshold voltage (also known as charge level boundary point and denoted VD). The amount of charge may be used to determine the programmed level (logical value) of the cell. Due to inaccuracies during the programming procedure and charge loss due to time and temperature (also known as retention), the measured levels may suffer from a random distortion.

In multi-level cell flash memory devices, each cell can store more than one bit per cell. The program level of each cell is determined by an n-tuple of bits (e.g., n=1, 2, 3). The cell might not be directly programmed to one of its possible program levels in a single step. Program levels may be written in stages, where in each stage only a single bit is programmed.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
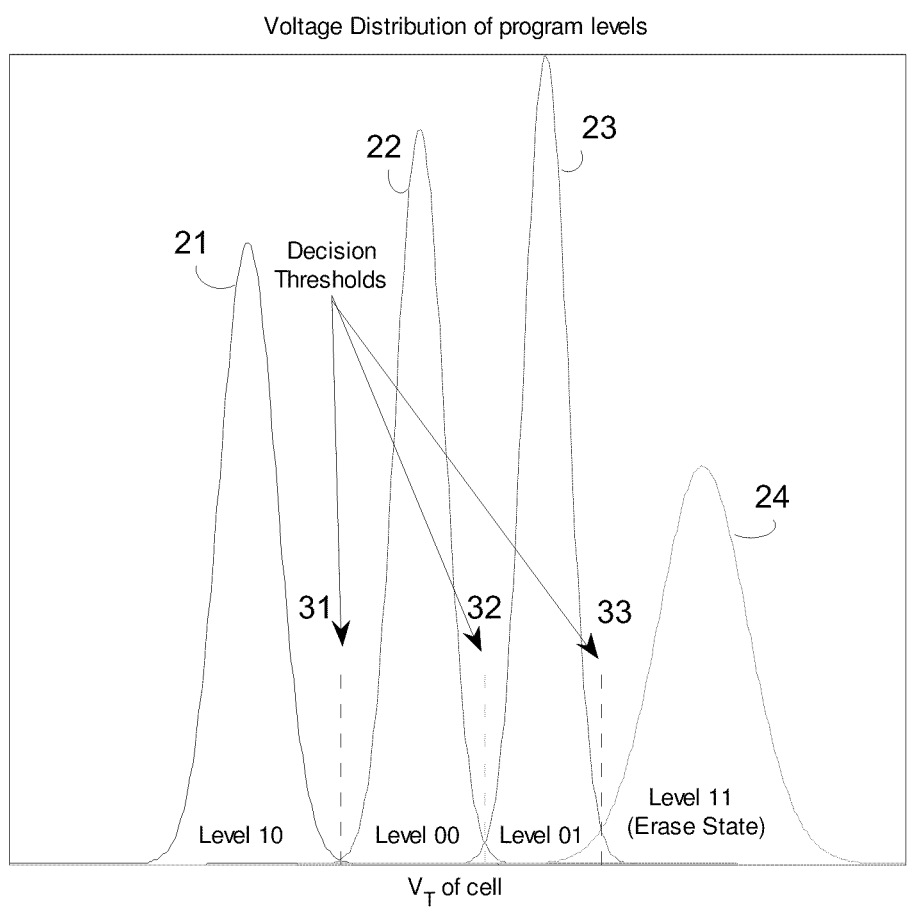
FIG. 1 illustrates an example of a prior art voltage distribution of a two bits-per cell.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

FIG. 1 illustrates an example of a voltage distribution of a two-bit cell. In this example, there are four separate probability distributions (four lobes) 21, 22, 23, 24 of a threshold voltage cell which can be programmed with one of four corresponding program levels (10, 00, 01 and 11, respectively). For each distribution curve, the Y-axis represents the probability that the cell is programmed to the corresponding level, given the value of the charge level (represented by the X-axis). The voltage window (W) is the voltage difference between the means of the two extreme distributions.

The cell's programmed level may be determined using several methods. One method is to apply a voltage to the cell's gate and measure if the cell conducts current. The cell may have a certain threshold voltage such that if voltage above that threshold is applied to the gate, the gate will conduct. Below that threshold voltage, the gate will not conduct current (or will conduct a small amount of current, below a certain demarcation level). As the amount of charge in the cell changes this threshold voltage, the charge may be inferred by determining at which voltage the cells starts to conduct current. Thus, the programmed level may be determined by iteratively applying different voltages to the gate and measuring whether the cells conduct or not.

Another method to determine a cell's programmed level may be to apply a voltage above the threshold voltage, the cell conducts current and the amount of current may depends on the difference between the applied voltage and the threshold voltage. As the threshold voltage changes as a function of the amount of charge in the cell, the programmed level may be inferred by measuring the current going through the cell.

Thus, the programmed level may be obtained by simultaneously comparing the conducted current with a given set of fixed currents distinguishing between all programmed levels. Each cell's programmed level may be determined by simultaneously comparing the VT level against several decision threshold levels 31, 32, 33. For example, if there are four possible programmed levels, the cell's VT may be simultaneously compared against three decision threshold levels 31, 32, 33 that may divide the voltage axis into four regions.

Figure 2:
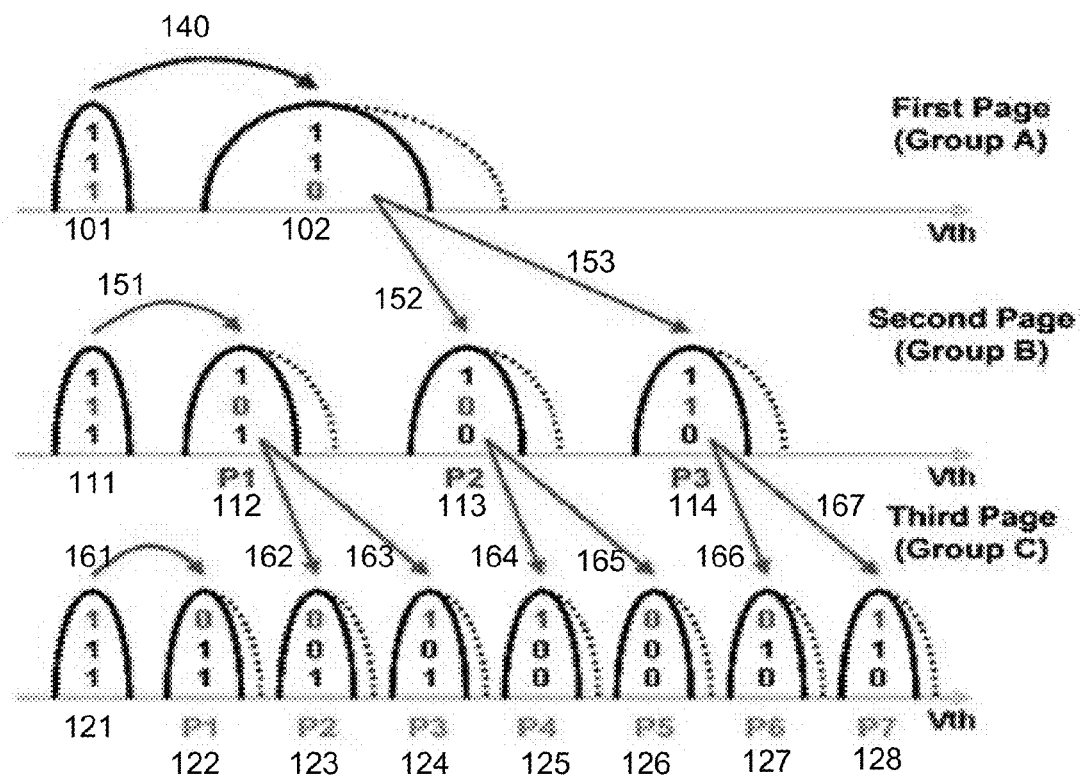
FIG. 2 illustrates multiple lobes for MSB, CSB, and LSB programming according to the prior art.

FIG. 2 depicts writing program levels in stages for a flash memory device storing three bits per cell. FIG. 2 illustrates multiple lobes for most significant bit (MSB), center significant bit (CSB), and least significant bit (LSB) programming—e.g., two MSB lobes 101, 102; four CSB lobes 111-

114; and eight LSB lobes 121-128. MSB programming is illustrated by arrow 140; CSB programming is illustrated by arrows 151-153, and LSB programming is illustrated by arrows 161-167.

MSB programming may be done using a single program level (in addition to an erase level). If the MSB equals 1, no programming is done and the cell may remain in the erase state. Otherwise, the cell is programmed to a certain program level.

When the CSB is programmed, if the MSB equals 1 the erased state is either left unchanged, or the cell is programmed to the first program level, depending on the value of the CSB. If the MSB equals 0, the single program level of the MSB is shifted to one of two new program levels, depending on the value of the CSB. Thus, a cell whose MSB and CSB were programmed has one of four program levels (including the erase state).

In order to program the LSB, the MSB and CSB of the cell may first be read. Then, according to the value of the LSB, the erase state either remains unchanged, or the cell may be programmed to a new program level. Similarly, the remaining three CSB program levels may be shifted by one of two possible voltage offsets to two new program levels.

In some implementations some pages can be only MSB programmed, some pages can be only CSB programmed and some pages can be only LSB programmed.

Programming the cells as described above may reduce the effect of coupling between adjacent cells in the memory array (intra-row coupling reduction). If, at each time, only one bit is programmed to a cell then the changes in threshold voltage occur only within a small voltage window. This reduces the interference that adjacent cells may experience due to programming neighboring cells. The procedure outlined above may be referred as decoupling.

Programming a cell to a given threshold voltage (or charge level) may involve applying a sequence of voltage pulses on the cell's gate, thereby causing the insertion of an electric charge into the floating gate. After each pulse is applied, the threshold level of the cell may be measured. If the target level has been reached, further voltage pulses may not need to be applied to this cell. If, on the other hand, the target threshold voltage has not been reached, the voltage pulses may be continued.

Choosing a larger voltage for the programming pulse may increase the amount of charge inserted at each time, and may have the effect of speeding up the programming time. Because the pulses may be applied until the actual threshold voltage is higher than the target value, a larger voltage may incur a greater inaccuracy in the final threshold voltage. As the pulses' amplitude increases, the standard deviation (STD) of the threshold voltage may increase. The increase of the threshold voltage STD may indicate a higher detection error rate and a possible degradation of reliability.

Different pulses may be used to program the MSB, CSB, and/or LSB. When programming the MSB, since only two program levels are present, a larger STD can be tolerated, and a larger pulse voltage can be used. When programming the LSB, smaller voltages may be required, in order to keep the standard deviation at the minimum required by the error correcting code. Programming the MSB may be faster than programming the LSB.

The programming process may be done in parallel on a set of cells arranged in physical rows. A physical row may be a set of consecutive rows and can include one or more nonvolatile memory pages and/or a portion of a nonvolatile memory page. A cell in a physical row, when programmed to a certain bit position, may be charged to one of two voltages depending on the bit value and the programming voltages. While programming a certain row, all other physical rows of the block may be provided with a pass voltage (Vpass),—i.e., a high voltage may be applied to their gate controls which switch the cells into a conductive state. The conductance of all the other cells in the string may allow a current to follow and charge the selected cell. The application of voltage on the un-selected cells might cause unintentional programming of these cells. This behavior is called a programming disturb. A high Vpass may cause column programming disturbs while a low Vpass might cause row programming disturbs.

A LSB cell may be very sensitive to program disturbs, therefore the LSB of a given row may be written after programming the MSB and CSB pages of the consecutive rows. The same applies for CSB pages: a CSB page may be programmed only after all MSB pages of consecutive rows are programmed to reduce program disturbs for the CSB page(s).

The following table illustrates this concept:

TABLE 1

| Row # | MSB | CSB | LSB |
|---|---|---|---|
| 0 | 0 | 2 | 5 |
| 1 | 1 | 4 | 8 |
| 2 | 3 | 7 | 11 |
| 3 | 6 | 10 | 14 |
| 4 | 9 | 13 | 17 |
| 5 | 12 | 16 | 20 |
| 6 | 15 | 19 | 22 |
| 7 | 18 | 21 | 23 |

The numbers 0-23 indicate the sequence order of the rows being programmed (in this example there are 8 rows and each row is programmed to 3 bits per cells). Note that for any given LSB page, MSB and CSB pages of neighboring rows are programmed before that LSB page. For example, to decrease and/or reduce programming disturbs, the LSB page number 14 in row number 3 is programmed after MSB and CSB pages of row number 3 are programmed (pages 6 and 10) and not before the MSB and CSB pages of row number 4 are programmed This type of programming can be referred to as "Type 1" programming, since the LSB is written after MSB and CSB pages of the next row (+1 rows) are programmed Similarly, other types of programming may be defined (e.g., Type 2, Type 3, etc.). Type 0 may be a horizontal programming type, where the first page is the MSB page of row 0, the second page is the CSB page of row 0, the third page is the LSB page of row 0, the fourth page is the MSB page of row 1, etc.

For flash arrays with even/odd rows in each block the same concept may be used, where the even rows and the odd rows are ordered as shown in the following table:

TABLE 2

| Row # | MSB | CSB | LSB | Row # | MSB | CSB | LSB |
|---|---|---|---|---|---|---|---|
| 0 | 0 | 4 | 10 | 1 | 1 | 5 | 11 |
| 2 | 2 | 8 | 16 | 3 | 3 | 9 | 17 |
| 4 | 6 | 14 | 22 | 5 | 7 | 15 | 23 |
| 6 | 12 | 20 | 28 | 7 | 13 | 21 | 29 |
| 8 | 18 | 26 | 34 | 9 | 19 | 27 | 35 |
| 10 | 24 | 32 | 40 | 11 | 25 | 33 | 41 |
| 12 | 30 | 38 | 44 | 13 | 31 | 39 | 45 |
| 14 | 36 | 42 | 46 | 15 | 37 | 43 | 47 |

Again, the numbers indicates the page ordering. The left part of the table applies for even rows and the right part applies for odd rows. As shown, the same concept is applied here, where each LSB page may be programmed only after all MSB/CSB pages of consecutive rows were programmed.

The following examples refer to a three-bit per cells but the method, devices and computer readable medium that embody the invention may be applied mutatis mutandis to cells that can store more than three bits per cell and to cells that can store a pair of bits.

A method in accordance with an embodiment of the invention may program a nonvolatile memory block by one or more programming phases of decreasing bit significance, where each programming phase programs all pages having the same bit significance. The programming method can start by performing a MSB programming phase in which all MSB pages of the nonvolatile memory block are programmed, then performing a CSB programming phase in which all CSB pages of the nonvolatile memory block are programmed, and finally performing a LSB programming phase in which all LSB pages of the nonvolatile memory block are programmed.

The terms "MSB pages", "CSB pages" and "LSB pages" are logical notions and these different types of pages can be programmed to the same nonvolatile memory row. It is also noted that partially programmed nonvolatile memory rows can also exist—for example, some nonvolatile memory rows can be programmed only as MSB pages, and/or only by another type of programming.

Table 3 illustrates three programming phases of a nonvolatile memory block that includes eight rows. The values included in Table 3 illustrate the programming order. The leftmost column of Table 3 illustrates a MSB programming phase (in which all pages may be programmed by MSB programming) that may be followed by a CSB programming phase (in which all pages may be programmed by CSB programming) that in turn is followed by a LSB programming phase (in which all pages may be programmed according to LSB programming).

Each of these programming phases exhibits a descending row programming order—e.g., starting from the last row (e.g., row 7) of the nonvolatile memory block and ending at the first row (e.g., row 0) of the nonvolatile memory block.

TABLE 3

| Row # | MSB | CSB | LSB |
|---|---|---|---|
| 0 | 7 | 15 | 23 |
| 1 | 6 | 14 | 22 |
| 2 | 5 | 13 | 21 |
| 3 | 4 | 12 | 20 |
| 4 | 3 | 11 | 19 |
| 5 | 2 | 10 | 18 |
| 6 | 1 | 9 | 17 |
| 7 | 0 | 8 | 16 |

This programming order can be referred to as "type ∞" (type infinity) or "type n", where n is a number of rows in the block.

The row programming order in which the nonvolatile memory block is programmed per each programming phase—e.g., for each page type of programming (MSB/CSB/LSB)—can be arbitrary. For example, Table 4 illustrates an ascending row programming order of the MSB programming phase, a descending programming order for the CSB programming phase, and an ascending programming order for the LSB programming phase.

TABLE 4

| Row # | MSB | CSB | LSB |
|---|---|---|---|
| 0 | 0 | 15 | 16 |
| 1 | 1 | 14 | 17 |
| 2 | 2 | 13 | 18 |
| 3 | 3 | 12 | 19 |
| 4 | 4 | 11 | 20 |
| 5 | 5 | 10 | 21 |
| 6 | 6 | 9 | 22 |
| 7 | 7 | 8 | 23 |

Table 5 illustrates an interleaved row programming order where within the MSB programming phase, the CSB programming phase, and the LSB programming phase even rows may be programmed in an ascending manner, and then followed by the odd rows programmed in an ascending manner.

TABLE 5

| Row # | MSB | CSB | LSB |
|---|---|---|---|
| 0 | 0 | 8 | 16 |
| 1 | 4 | 12 | 20 |
| 2 | 1 | 9 | 17 |
| 3 | 5 | 13 | 21 |
| 4 | 2 | 10 | 18 |
| 5 | 6 | 14 | 22 |
| 6 | 3 | 11 | 19 |
| 7 | 7 | 15 | 23 |

Table 6 illustrates an interleaved row programming order between odd and even nonvolatile memory blocks. Table 6 illustrates a MSB programming phase in which odd and even rows are MSB programmed in an interleaved manner starting from the first odd and even row pair and ending at the last odd and even row pair. The MSB programming phase may be followed by a CSB programming phase in which odd and even rows are CSB programmed in an interleaved manner starting from the first odd and even row pair and ending at the last odd and even row pair. The CSB programming phase may be followed by a LSB programming phase in which odd and even rows are LSB programmed in an interleaved manner starting from the first odd and even row pair and ending at the last odd and even row pair. Accordingly, all of the programming phases of Table 6 exhibit an ascending interleaved row programming order.

TABLE 6

| Row # | MSB | CSB | LSB | Row # | MSB | CSB | LSB |
|---|---|---|---|---|---|---|---|
| 0 | 0 | 16 | 32 | 1 | 1 | 17 | 33 |
| 2 | 2 | 18 | 34 | 3 | 3 | 19 | 35 |
| 4 | 4 | 20 | 36 | 5 | 5 | 21 | 37 |
| 6 | 6 | 22 | 38 | 7 | 7 | 23 | 39 |
| 8 | 8 | 24 | 40 | 9 | 9 | 25 | 41 |
| 10 | 10 | 26 | 42 | 11 | 11 | 27 | 43 |
| 12 | 12 | 28 | 44 | 13 | 13 | 29 | 45 |
| 14 | 14 | 30 | 46 | 15 | 15 | 31 | 47 |

Table 7 illustrates an interleaved row programming order between odd and even nonvolatile memory blocks. Table 7 illustrates a MSB programming phase that may be followed by a CSB programming phase, and then a LSB programming phase. Within each of these (MSB, CSB, and/or LSB) programming phases odd and even rows may be programmed in an interleaved manner where the odd rows may be programmed in an ascending order and the even rows may be programmed in a descending manner.

TABLE 7

| Row # | MSB | CSB | LSB | Row # | MSB | CSB | LSB |
|---|---|---|---|---|---|---|---|
| 0 | 0 | 16 | 32 | 1 | 15 | 31 | 47 |
| 2 | 2 | 18 | 34 | 3 | 13 | 29 | 45 |
| 4 | 4 | 20 | 36 | 5 | 11 | 27 | 43 |
| 6 | 6 | 22 | 38 | 7 | 9 | 25 | 41 |
| 8 | 8 | 24 | 40 | 9 | 7 | 23 | 39 |
| 10 | 10 | 26 | 42 | 11 | 5 | 21 | 37 |
| 12 | 12 | 28 | 44 | 13 | 3 | 19 | 35 |
| 14 | 14 | 30 | 46 | 15 | 1 | 17 | 33 |

The programming phases shown in Table 7 may reduce programming disturbs to LSB pages, since all MSB and CSB pages in the nonvolatile memory block are programmed, using coarse incremental-step-pulse programming (ISPP) pluses, prior to LSB programming.

The above-mentioned interleaved programming schemes can be applied in cases where different nonvolatile memory blocks reside on different integrated circuits.

A non-limiting example of a programming order in accordance with an embodiment of the invention is illustrated in Table 8. Table 8 illustrates an interleaved programming scheme in which three integrated circuit dies may be programmed so that parallel programming can be applied on different integrated circuits. For example, while rows of one integrated circuit may be programmed by a MSB programming phase, rows of another integrated circuit is programmed by a CSB programming phase and rows of a further integrated circuit is programmed by a LSB programming phase. Other combinations of programming phases may be implemented among the integrated circuit dies. In Table 8, the notation IP refers to individual programming as some cells may be individually programmed when the process is initiated and ended.

According to an embodiment of the invention, programming disturbs can be reduced for other page types—e.g., CSB pages and LSB pages. This can be achieved by applying different values of Vpass depending on the bit type currently being programmed. The MSB and CSB pages may suffer less programming disturbs due to a high Vpass.

Applying a different value Vpass on type 1 row programming order (or any order smaller than the number of rows in a block) may not be done, since for most MSB and CSB pages in a given row there may be a preceding programmed row with an LSB page.

Experiment shows that applying a different Vpass while using the proposed page order can reduce programming disturbs. When using programming ordering as illustrated in Table 7, the first even rows may be disturbed due to the programming of the odd rows, while the last odd rows may be disturbed due to the programming of even rows. In this way, the even/odd rows may behave similarly in terms of programming disturbs. When applying the programming order illustrated in Table 5, even rows may experience slightly higher programming disturbs due to odd rows programming, however, odd rows may experience lower programming disturbs since no neighboring rows are subsequently programmed.

Different Vpass values may be applied during read operations. Different Vpass values can be applied to nonvolatile memory blocks which are not programmed with LSB/CSB pages. A lower Vpass may reduce unintentional read disturbs to already programmed pages and to erased cells.

A method in accordance with an embodiment of the invention can be utilized to reduce block erase duration along with reduction in reliability failures due to erase. An erase process may be performed by charging all the cells in the block to the highest charge value and then erasing (discharging) all the

TABLE 8

| Block # | row # | Die #0 | | | Die #1 | | | Die #2 | | |
|---|---|---|---|---|---|---|---|---|---|---|
| | | MSB | CSB | LSB | MSB | CSB | LSB | MSB | CSB | LSB |
| 0 | 0 | 0 | 25 | 50 | IP | 1 | 26 | IP | IP | 2 |
| | 1 | 3 | 28 | 53 | IP | 4 | 29 | IP | IP | 5 |
| | 2 | 6 | 31 | 56 | IP | 7 | 32 | IP | IP | 8 |
| | 3 | 9 | 34 | 59 | IP | 10 | 35 | IP | IP | 11 |
| | 4 | 12 | 37 | 62 | IP | 13 | 38 | IP | IP | 14 |
| | 5 | 15 | 40 | 65 | IP | 16 | 41 | IP | IP | 17 |
| | 6 | 18 | 43 | 68 | IP | 19 | 44 | IP | IP | 20 |
| | 7 | 21 | 46 | 71 | IP | 22 | 47 | IP | IP | 23 |
| 1 | 0 | 24 | 49 | 74 | 48 | 73 | 98 | 72 | 97 | 120 |
| | 1 | 27 | 52 | 77 | 51 | 76 | 101 | 75 | 100 | 123 |
| | 2 | 30 | 55 | 80 | 54 | 79 | 104 | 78 | 103 | 126 |
| | 3 | 33 | 58 | 83 | 57 | 82 | 107 | 81 | 106 | 129 |
| | 4 | 36 | 61 | 86 | 60 | 85 | 110 | 84 | 109 | 132 |
| | 5 | 39 | 64 | 89 | 63 | 88 | 113 | 87 | 112 | 135 |
| | 6 | 42 | 67 | 92 | 66 | 91 | 116 | 90 | 115 | 138 |
| | 7 | 45 | 70 | 95 | 69 | 94 | 119 | 93 | 118 | 141 |
| 2 | 0 | 96 | 119 | 144 | 118 | 143 | 168 | 142 | 167 | 192 |
| | 1 | 99 | 122 | 147 | 121 | 146 | 171 | 145 | 170 | 195 |
| | 2 | 102 | 125 | 150 | 124 | 149 | 174 | 148 | 173 | 198 |
| | 3 | 105 | 128 | 153 | 127 | 152 | 177 | 151 | 176 | 201 |
| | 4 | 108 | 131 | 156 | 130 | 155 | 180 | 154 | 179 | 204 |
| | 5 | 111 | 134 | 159 | 133 | 158 | 183 | 157 | 182 | 207 |
| | 6 | 114 | 137 | 162 | 136 | 161 | 186 | 160 | 185 | 210 |
| | 7 | 117 | 140 | 165 | 139 | 164 | 189 | 163 | 188 | 213 |
| 3 | 0 | 166 | 191 | 216 | 190 | 215 | IP | 214 | IP | IP |
| | 1 | 169 | 194 | 219 | 193 | 218 | IP | 217 | IP | IP |
| | 2 | 172 | 197 | 222 | 196 | 221 | IP | 220 | IP | IP |
| | 3 | 175 | 200 | 225 | 199 | 224 | IP | 223 | IP | IP |
| | 4 | 178 | 203 | 228 | 202 | 227 | IP | 226 | IP | IP |
| | 5 | 181 | 206 | 231 | 205 | 230 | IP | 229 | IP | IP |
| | 6 | 184 | 209 | 234 | 208 | 233 | IP | 232 | IP | IP |
| | 7 | 187 | 212 | 237 | 211 | 236 | IP | 235 | IP | IP | cells together. The programming phase may ensure that cells are discharged starting the same charge value. In three bit per cell (e.g., eight-level) devices, a high charge voltage may be applied to accommodate the seven cell programming levels. When erasing a block, a very high voltage may be applied in the programming phase of the erase process. This high voltage stress may cause the flash to wear out. Moreover, the programming phase may prolong the erase process.

In accordance with an embodiment of the invention the erase operation (programming to an erase value) may be preceded by programming to a pre-erase value, which may differ per type of programming phase. The erasing (programming to an erase value) can be executed by three different erase operations according to the block state where a state is defined by the maximum number of bits programmed to any physical row on the block (e.g., a TLC block may have three states: MSB, CSB and LSB) each erase operation may include programming to a different pre-erase value and then programming to an erase value.

For example, to erase an MSB blocks, i.e., nonvolatile memory blocks which may be programmed only with MSB pages, we can apply an "MSB erase" operation. During the programming phase of the erase operation, the cells of the nonvolatile memory blocks may be programmed to a voltage that may be slightly above the highest probable MSB voltage. Similar erase operations can be defined to CSB blocks and LSB blocks.

The programming to a lower voltage prior to the erase may decrease the stress on the cells which in turn may reduce reliability failures. This technique may also be applied to blocks that may be programmed only with CSB and/or MSB pages.

The type of erase command to be applied can be managed by a flash controller, which may track which bit type was programmed lately, or can be done internally by a flash microcontroller. When using a different erase operation on the blocks, a flash controller can apply a different program/erase (P/E) cycle wear count according to the specific erase operation which was done. The different P/E cycle counts of different erase operations can be united to a single count value where each erase operation has a different count weight. For example, a MSB (SLC) erase can have a weight=1, CSB (MLC) erase can have a weight=10, and LSB (TLC) erase can have a weight=1000. The counter can be advanced using the different weights of the different erase operations.

According to an embodiment of the invention the information stored in multiple nonvolatile memory blocks of a single bit per cell (source blocks) can be jointly programmed into a single nonvolatile memory block of multiple bit per cell (destination block). The programming may include the programming phases discussed above. The information in each target block may be programmed by a programming phase, in which the programming phases may differ from each other by their bit significance.

For example, in an embodiment according to the present invention, a memory controller can "pack" three SLC nonvolatile memory blocks to one three-bit per cell ("3 bpc") nonvolatile memory block by programming the information of the first SLC nonvolatile memory block by a MSB programming phase, programming the information of the second SLC nonvolatile memory block by a CSB programming phase, and finally programming the information of the third SLC nonvolatile memory block by a LSB programming phase. This programming scheme can be performed without an additional buffer for temporarily storing the content of three SCL nonvolatile memory blocks.

The method in accordance with an embodiment of the invention can be utilized when a stream of data is to be programmed rapidly as a SLC nonvolatile memory block, while later these SLC nonvolatile memory blocks can be packed up to 3 bpc nonvolatile memory blocks. A flash controller which may utilize the proposed ordering can dynamically hold a pool of SLC/MLC and 3 pbc blocks and change the partition dynamically with a lower penalty compared to standard programming order.

Figure 3:
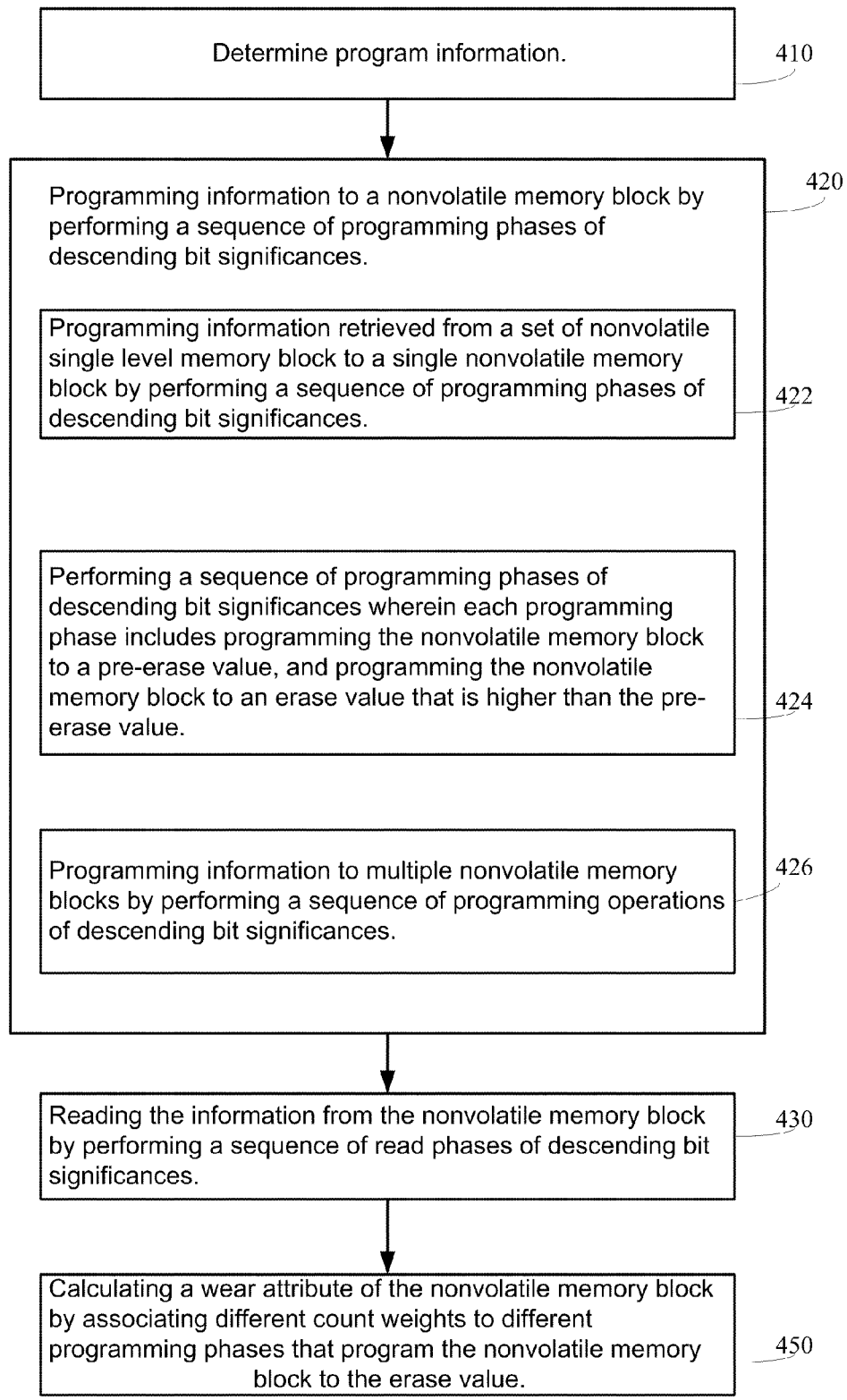
FIG. 3 illustrates a method according to an embodiment of the invention.

FIG. 3 illustrates method 400 in accordance with an embodiment of the invention. Method 400 may determine, step 410, program information. This determination may be made by a receiving a request or command for program information, receiving information to be programmed, and/or otherwise determining that information should be programmed.

A memory controller may program information, stage 420, to a nonvolatile memory block by performing a sequence of programming phases of descending bit significances. The sequence of programming phases of descending bit significances can start from a most significant bit programming phase and can end at a least significant bit programming phase.

Step 420 can include programming all the nonvolatile memory rows of the nonvolatile memory block during each programming phase of the sequence. The programming can include at least one of the following: (i) performing a programming order where at least two programming phases of the sequence differ from each other; (ii) performing one programming phase of the sequence that may exhibit an ascending row programming order and performing another programming phase of the sequence that may exhibit a descending row programming order; (iii) performing at least one programming phase of the sequence that may exhibit an interleaved row programming order; (iv) performing at least one programming phase of the sequence that may exhibit an interleaved row programming order between odd and even nonvolatile memory blocks; and (v) performing at least two programming phases of the sequence that may have the same row programming order.

Programming information of step 420 can include providing a pass voltage to idle nonvolatile memory rows—e.g., rows that are not being filed. At least two programming phases of the sequence can differ in a level of pass voltage that is supplied to the idle nonvolatile memory rows. Step 420 can include supplying a low level Vpass during MSB page programming, a moderate level Vpass during CSB programming, and a higher level Vpass during LSB programming (e.g., the level of Vpass may increase as a bit significance of a programming phase decreases). With reference to FIG. 2, the MSB pages are shown as the first page programming Group A. In one embodiment in accordance with the invention, step 420 can include programming information retrieved from a set of nonvolatile single level memory block to a single nonvolatile memory block by performing a sequence of programming phases of descending bit significances, step 422.

Method 400 can include programming the nonvolatile memory block to erase values, thereby erasing the nonvolatile memory block. In accordance with one embodiment of the invention, step 420 can include performing a sequence of programming phases of descending bit significances, step 424. Each of these programming phases of step 424 may include programming the nonvolatile memory block to a pre-erase value, and programming the nonvolatile memory block to an erase value that may be higher than the pre-erase value. At least two programming phases of stage 424 can differ in the pre-erase value. A level of pre-erase value can decrease with a decrement of a bit significance of a programming phase during step 424. An erase operation may be adapted according to the block programming state. If only MSB pages are programmed, an MSB erase operation may be done. If only MSB and CSB pages are programmed, then a CSB erase operation may be carried out. If there are some LSB pages programmed, a full erase operation may be done. In a MSB erase operation, the maximum pre-erase program voltage can be low in comparison to the full erase operation. There may be a set of different erase operations when each operation is employed according to the block program state.

In accordance with an embodiment of the invention, step 420 can include a memory controller programming information to multiple nonvolatile memory blocks, step 426, where each nonvolatile memory block may be programmed by performing a sequence of programming phases of descending bit significances. At least two of the nonvolatile memory blocks can belong to different integrated circuits.

Method 400 may continue with the memory controller reading the information, step 430, from the nonvolatile memory block by performing a sequence of read phases of descending bit significances, starting from a most significant bit programming phase and ending at a least significant bit programming phase.

Method 400 can calculate, step 450, a wear attribute of the nonvolatile memory block by associating different count weights to different programming phases that program the nonvolatile memory block to the erase value.

Method 400 can be applied to a nonvolatile memory block that can be programmed to include multiple pages, starting from a MSB page and ending at a CSB page. Method 400 can be applied on partially programmed nonvolatile memory blocks, e.g., those programmed according to a subset of the possible programming types.

Method 400 can be applied to partially programmed nonvolatile memory blocks where it may be that not all of the programming types (MSB, CSB, LSB) exist. Method 400 can be applied to these partially programmed blocks.

Figure 4:
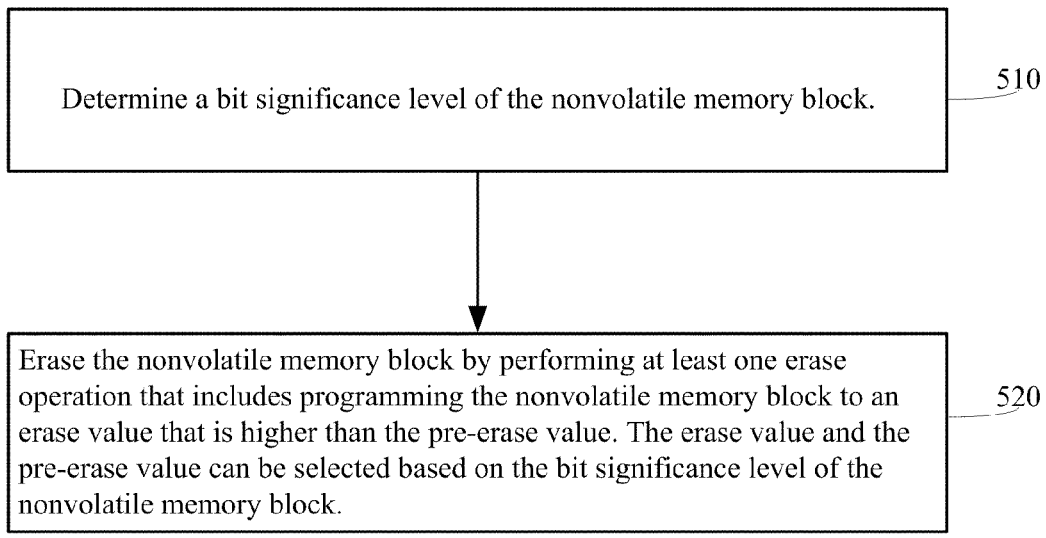
FIG. 4 illustrates a method according to an embodiment of the invention.

FIG. 4 illustrates method 500 according to an embodiment of the invention for erasing a nonvolatile memory block. Method 500 may start by determining, step 510, a bit significance level of the nonvolatile memory block. Method 500 can include fine tuning of the type of erase phases to be applied on the nonvolatile memory block. For example, a nonvolatile memory block that may be only MSB programmed, may only need a single MSB erase phase.

Method 500 may erase, step 520, the nonvolatile memory block by performing at least one erase phase. The erase phase may include programming the nonvolatile memory block to an erase value that may be higher than the pre-erase value. The erase value and the pre-erase value can be selected based on the bit significance level of the nonvolatile memory block.

Figure 5:
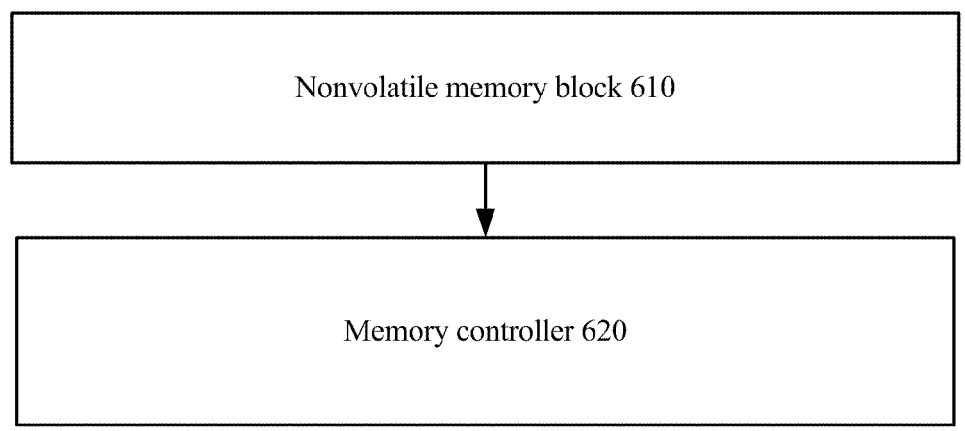
FIG. 5 illustrates a device according to an embodiment of the invention.

FIG. 5 illustrates device 600 in accordance with an embodiment of the invention. Device 600 may include nonvolatile memory block 610 and memory controller 620 that can be configured to program information to the nonvolatile memory block by performing a sequence of programming phases of descending bit significances.

Device 600 can execute any of the methods in accordance with one or more embodiments of the invention, including methods 400, 500, 600, or any of their steps.

Memory controller 610 can be configured to perform each of the following and/or a combination thereof: (i) perform a sequence of programming phases of descending bit significances that may start from a most significant bit programming phase and may end at a least significant bit programming phase; (ii) program the nonvolatile memory rows of the nonvolatile memory block during each programming phase of the sequence; (iii) perform the sequence of programming phases of descending bit significances where at least two programming phases of the sequence may differ by row programming order from each other; (iv) perform a sequence of programming phases of descending bit significances where one programming phase of the sequence may exhibit an ascending row programming order and another programming phase of the sequence may exhibit a descending row programming order; (v) perform a sequence of programming phases of descending bit significances where at least one programming phase of the sequence may exhibit an interleaved row programming order; (vi) perform a sequence of programming phases of descending bit significances where at least one programming phase of the sequence may exhibit an interleaved row programming order between odd and even nonvolatile memory blocks; (vii) perform a sequence of programming phases of descending bit significances where at least two programming phases of the sequence may have the same row programming order; (viii) perform a sequence of programming phases of descending bit significances where at least two programming phases of the sequence may differ in a level of pass voltage that may be supplied to idle nonvolatile memory rows; (ix) perform a sequence of programming phases of descending bit significances where a level of the pass voltage may decrease as a bit significance of a programming phase decreases; (x) perform a sequence of programming phases of descending bit significances to program information retrieved from a set of nonvolatile single level memory blocks to a single nonvolatile memory block; (xi) perform a sequence of programming phases of descending bit significances where each programming phase may include programming the nonvolatile memory block to a pre-erase value; and programming the nonvolatile memory block to an erase value that may be higher than the pre-erase value; (xii) perform a sequence of programming phases of descending bit significances where at least two programming phases may differ in the pre-erase value; (xiii) perform a sequence of programming phases of descending bit significances where a level of pre-erase value may decrease with a decrement of a bit significant of a programming phase; (xiv) perform a sequence of programming phases of descending bit significances where the memory controller may be configured to calculate a wear attribute of the nonvolatile memory block by associating different count weights to different programming phases that program the nonvolatile memory block to the erase value; (xv) perform a sequence of programming phases of descending bit significances where the memory controller may be configured to determine a bit significance level of the nonvolatile memory block; and start the sequence of programming phases from a programming phase that may correspond to the bit significance level of the nonvolatile memory block; (xvi) read the information from the nonvolatile memory block by a performing a sequence of read phases of descending bit significances, starting from a most significant bit programming phase and ending at a least significant bit programming phase; (xvii) perform a sequence of programming phases of descending bit significances of multiple nonvolatile memory blocks, where each nonvolatile memory block may be programmed by performing a sequence of programming phases of descending bit significances; (xviii) perform a sequence of programming phases of descending bit significances of multiple nonvolatile memory blocks, where each nonvolatile memory block may be programmed by performing a sequence of programming phases of descending bit significances, where at least two nonvolatile memory blocks belong to different integrated circuits.

In accordance with an embodiment of the invention, memory controller 620 may be configured to determine a bit significance level of the nonvolatile memory block; program the nonvolatile memory block by performing at least one programming phase; and program the nonvolatile memory block to an erase value that may be higher than the pre-erase value; where the erase value and the pre-erase value may be selected based on the bit significance level of the nonvolatile memory block.

Any of the mentioned above methods can be executed by a memory controller that can execute instructions that are stored on a computer readable medium. The computer readable medium can be a tape, a cassette, a disk, a diskette, an integrated circuit, and the like. For example, the computer readable medium can store instructions for: determining a bit significance level of a nonvolatile memory block; programming the nonvolatile memory block by performing at least one programming phase; and programming the nonvolatile memory block to an erase value that is higher than the pre-erase value; wherein the erase value and the pre-erase value are selected based on the bit significance level of the memory pages. Yet for another example, the computer readable medium can store instructions for programming information, by a memory controller, to a nonvolatile memory block by performing a sequence of programming phases of descending bit significances.

While there have been shown and described fundamental novel features of the invention as applied to several embodiments, it will be understood that various omissions, substitutions, and changes in the form, detail, and operation of the illustrated embodiments may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

The invention claimed is:

1. A method for programming a nonvolatile memory block that comprises multiple non-volatile memory rows, the method comprising: programming information, by a memory controller, to pages in the nonvolatile memory block by performing a sequence of programming phases in order of descending bit significances, wherein all pages stored in the multiple non-volatile memory rows of the same bit significance are programmed prior to pages stored in the multiple non-volatile memory rows having a descending bit significance.

2. The method of claim 1, wherein the sequence of programming phases starts from a most significant bit programming phase and ends at a least significant bit programming phase.

3. The method of claim 1, wherein a row programming order of at least two programming phases of the sequence of programming phases differ from each other.

4. The method of claim 1, wherein at least one programming phase of the sequence of programming phases exhibits an ascending row programming order and at least another programming phase of the sequence of programming phases exhibits a descending row programming order.

5. The method of claim 1, wherein at least one programming phase of the sequence of programming phases exhibits an interleaved row programming order.

6. The method of claim 1, wherein at least one programming phase of the sequence of programming phases exhibits an interleaved row programming order between odd and even nonvolatile memory blocks.

7. The method of claim 1, wherein at least two programming phases of the sequence of programming phases have a same row programming order.

8. The method of claim 1, wherein at least two programming phases of the sequence of programming phases differ in a level of pass voltage that is supplied to idle nonvolatile memory rows.

9. The method of claim 8, wherein a level of the pass voltage decreases as a bit significance of a programming phase decreases.

10. The method of claim 1, comprising programming information retrieved from a set of nonvolatile single level memory blocks to a single nonvolatile memory block by performing a sequence of programming phases of descending bit significances.

11. The method of claim 1, wherein each programming phase comprises programming the nonvolatile memory block to a pre-erase value that is above a highest probable programmed value of a certain bit significance level, and the method further comprises programming the nonvolatile memory block to an erase value that is higher than the pre-erase value.

12. The method of claim 11, wherein at least two programming phases differ in the pre-erase value.

13. The method of claim 11, wherein a level of the pre-erase value decreases with a decrement of a bit significant of a programming phase.

14. The method of claim 11, comprising calculating a wear attribute of the nonvolatile memory block by associating different count weights to different programming phases that program the nonvolatile memory block to the erase value.

15. The method of claim 1, comprising: determining a bit significance level of the nonvolatile memory block; and starting the sequence of programming phases from a programming phase that corresponds to the bit significance level of the nonvolatile memory block.

16. The method of claim 1, comprising reading the information, by the memory controller, from the nonvolatile memory block by performing a sequence of read phases of descending bit significances, starting from a most significant bit programming phase and ending at a least significant bit programming phase.

17. The method of claim 1, comprising programming information, by the memory controller, to multiple nonvolatile memory blocks, wherein each nonvolatile memory block is programmed by performing a sequence of programming phases of descending bit significances.

18. The method of claim 17, wherein at least two nonvolatile memory blocks belong to different integrated circuits.

19. The method of claim 1, further including: packing three single level cell (SLC) nonvolatile memory blocks to one three-bit per cell nonvolatile memory block by programming information of a first SLC nonvolatile memory block by a MSB programming phase, programming information of a second SLC nonvolatile memory block by a CSB programming phase, and programming the information of a third SLC nonvolatile memory block by a LSB programming phase.

20. A method for erasing a nonvolatile memory block, the method comprising: determining a bit significance level of one or more memory pages within the nonvolatile memory block; and programming the nonvolatile memory block by performing at least one programming phase, wherein each programming phase comprises programming the nonvolatile memory block to a pre-erase value and programming the nonvolatile memory block to an erase value that is higher than the pre-erase value, wherein the erase value and the pre-erase value are selected based on the bit significance level of the one or more memory pages within the nonvolatile memory block.

21. A device having programming capabilities, the device comprising: a nonvolatile memory block that comprises multiple non-volatile memory rows; and a memory controller configured to program information to pages in the nonvolatile memory block by performing a sequence of programming phases of descending bit significances, wherein all pages stored in the multiple non-volatile memory rows of the same bit significance are programmed prior to pages stored in the multiple non-volatile memory rows having a descending bit significance.

22. The device of claim 21, wherein the sequence of programming phases of descending bit significances starts from a most significant bit programming phase and ends at a least significant bit programming phase.

23. The device of claim 21, wherein the memory controller is configured to program the nonvolatile memory rows of the nonvolatile memory block during each programming phase of the sequence.

24. The device of claim 21, wherein at least two programming phases of the sequence differ by row programming order from each other.

25. The device of claim 21, wherein one programming phase of the sequence exhibits an ascending row programming order and another programming phase of the sequence exhibits a descending row programming order.

26. The device of claim 21, wherein at least one programming phase of the sequence exhibits an interleaved row programming order.

27. The device of claim 21, wherein at least one programming phase of the sequence exhibits an interleaved row programming order between odd and even nonvolatile memory blocks.

28. The device of claim 21, wherein at least two programming phases of the sequence have a same row programming order.

29. The device of claim 21, wherein at least two programming phases of the sequence differ in a level of pass voltage supplied to idle nonvolatile memory rows.

30. The device of claim 29, wherein the pass voltage level decreases as bit significance of a programming phase decreases.

31. The device of claim 21, wherein the memory controller is configured to program information retrieved from a set of nonvolatile single level memory blocks to a single nonvolatile memory block by performing the sequence of programming phases of descending bit significances.

32. The device of claim 21, wherein the memory controller is configured to program the nonvolatile memory block to a pre-erase value that is above a highest probable programmed value of a certain bit significance level, and program the nonvolatile memory block to an erase value that is higher than the pre-erase value, during each programming phase.

33. The device of claim 32, wherein at least two programming phases differ in the pre-erase value.

34. The device of claim 32, wherein the pre-erase value decreases with a decrement of a bit significance of a programming phase.

35. The device of claim 31, wherein the memory controller is configured to calculate a wear attribute of the nonvolatile memory block by associating different count weights to different programming phases that program the nonvolatile memory block to the erase value.

36. The device of claim 21, wherein the memory controller is configured to: determine a bit significance level of the nonvolatile memory block; and start the sequence of programming phases from a programming phase that corresponds to the bit significance level of the nonvolatile memory block.

37. The device of claim 21, wherein the memory controller is configured to read the information from the nonvolatile memory block by a performing a sequence of read phases of descending bit significances, starting from a most significant bit programming phase and ending at a least significant bit programming phase.

38. The device of claim 21, wherein the memory controller is configured to program multiple nonvolatile memory block, wherein each nonvolatile memory block is programmed by performing a sequence of programming phases of descending bit significances.

39. The device of claim 38, wherein at least two nonvolatile memory blocks belong to different integrated circuits.

40. The device of claim 21, wherein the memory controller is configured to pack three single level cell (SLC) nonvolatile memory blocks to one three-bit per cell nonvolatile memory block.

41. A device, comprising: a nonvolatile memory block; and a memory controller configured to: determine a bit significance level of one or more memory pages in the nonvolatile memory block; program the one or more memory pages within the nonvolatile memory block by performing at least one programming phase, wherein the memory controller is configured to program the one or more memory pages within the nonvolatile memory block to a pre-erase value and then program the one or more memory block to an erase value that is higher than the pre-erase value, during each programming phase, wherein the erase value and the pre-erase value are selected based on the bit significance level of the one or more memory pages within the nonvolatile memory block.

42. A non-transitory computer readable medium that stores instructions that once executed by a computer causes the computer to execute the stages of: determining a bit significance level of one or more memory pages within a nonvolatile memory block; programming the one or more memory pages within the nonvolatile memory block by performing at least one programming phase, wherein each programming phase comprises programming the one or more memory pages within the nonvolatile memory block to an erase value that is higher than a pre-erase value, wherein the erase value and the pre-erase value are selected based on the bit significance level of the one or more memory pages; wherein a pre-erase value of a certain bit significance level is above the highest probable programmed value of the certain bit significant level.

43. A non-transitory computer readable medium that stores instructions that once executed by a computer causes the computer to execute the stages of programming information, by a memory controller, to one or more memory pages within a nonvolatile memory block that comprises multiple non-volatile memory rows, by performing a sequence of programming phases in order of descending bit significances, wherein all pages stored in the multiple non-volatile memory rows of the same bit significance are programmed prior to pages stored in the multiple non-volatile memory rows having a descending bit significance.

* * * * *